United States Patent
Tang et al.

(10) Patent No.: US 8,685,825 B2
(45) Date of Patent: Apr. 1, 2014

(54) REPLACEMENT SOURCE/DRAIN FINFET FABRICATION

(75) Inventors: Daniel Tang, Fremont, CA (US);
Tzu-Shih Yen, Hsinchu (TW)

(73) Assignee: Advanced Ion Beam Technology, Inc., Hsin-Chu (TW)

( * ) Notice: Subject to any disclaimer, the term of this patent is extended or adjusted under 35 U.S.C. 154(b) by 0 days.

(21) Appl. No.: 13/192,378

(22) Filed: Jul. 27, 2011

(65) Prior Publication Data
US 2013/0026539 A1     Jan. 31, 2013

(51) Int. Cl.
*H01L 21/331* (2006.01)
*H01L 21/336* (2006.01)

(52) U.S. Cl.
USPC ............ 438/341; 438/300; 438/8; 438/157; 438/176; 438/413; 257/E21.409

(58) Field of Classification Search
USPC ............ 438/157, 166, 173, 268, 8, 142, 151, 438/176, 283, 197, 689, 300, 341, 357, 413, 438/416; 257/E21.409, E21.102, E21.177, 257/E21.219, E21.4
See application file for complete search history.

(56) References Cited

U.S. PATENT DOCUMENTS

| | | | |
|---|---|---|---|
| 2005/0253203 A1* | 11/2005 | Liaw | 257/397 |
| 2008/0135888 A1* | 6/2008 | Lee et al. | 257/255 |
| 2008/0160660 A1* | 7/2008 | Shim | 438/59 |
| 2009/0090976 A1* | 4/2009 | Kavalieros et al. | 257/369 |
| 2010/0148217 A1* | 6/2010 | Simonelli et al. | 257/192 |
| 2011/0147812 A1* | 6/2011 | Steigerwald et al. | 257/288 |

* cited by examiner

*Primary Examiner* — Cuong Q Nguyen
*Assistant Examiner* — Galina Yushina
(74) *Attorney, Agent, or Firm* — Morrison & Foerster LLP

(57) ABSTRACT

A finFET is formed having a fin with a source region, a drain region, and a channel region between the source and drain regions. The fin is etched on a semiconductor wafer. A gate stack is formed having an insulating layer in direct contact with the channel region and a conductive gate material in direct contact with the insulating layer. The source and drain regions are etched leaving the channel region of the fin. Epitaxial semiconductor is grown on the sides of the channel region that were adjacent the source and drain regions to form a source epitaxy region and a drain epitaxy region. The source and drain epitaxy regions are doped in-situ while growing the epitaxial semiconductor.

19 Claims, 14 Drawing Sheets

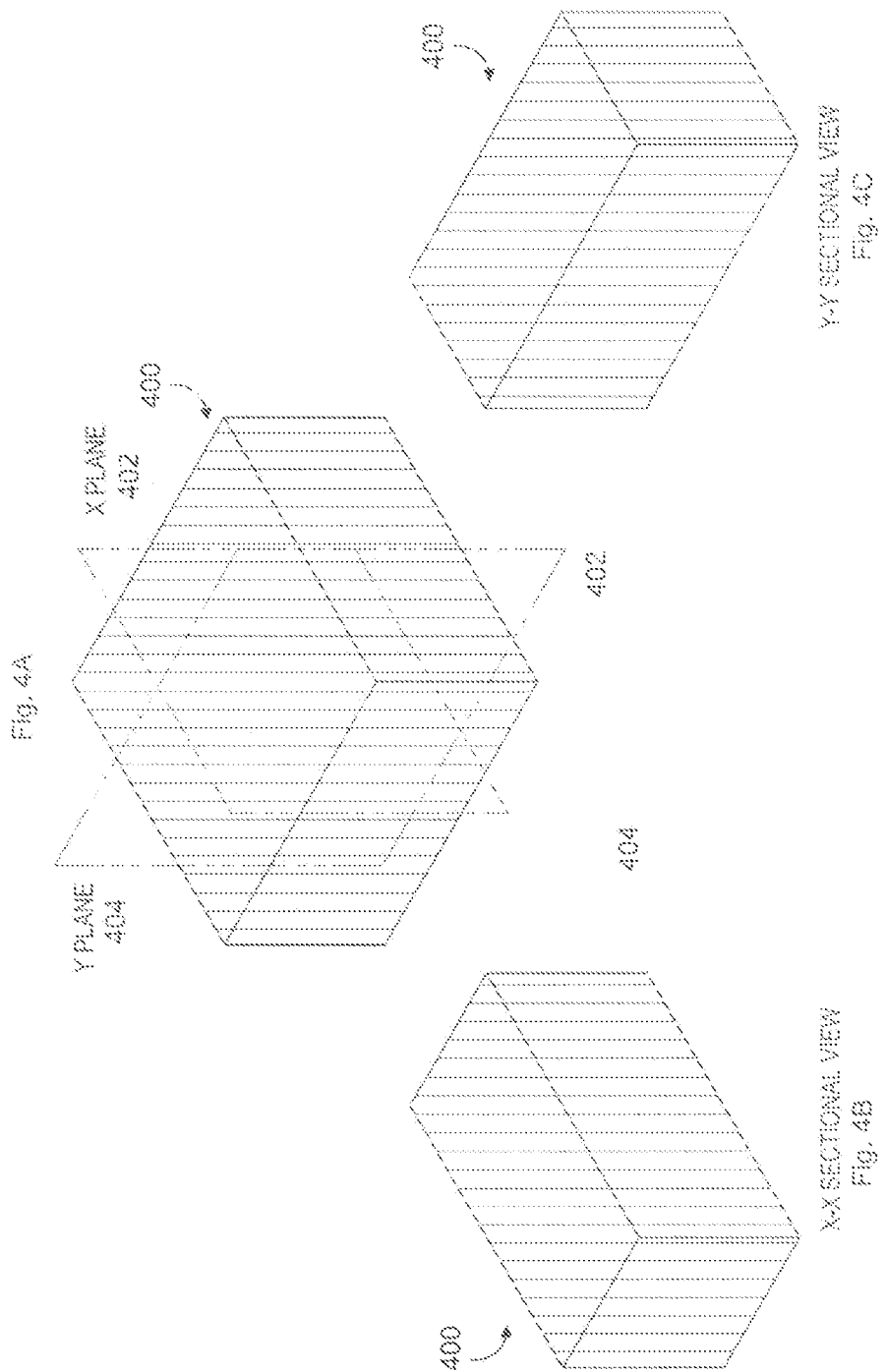

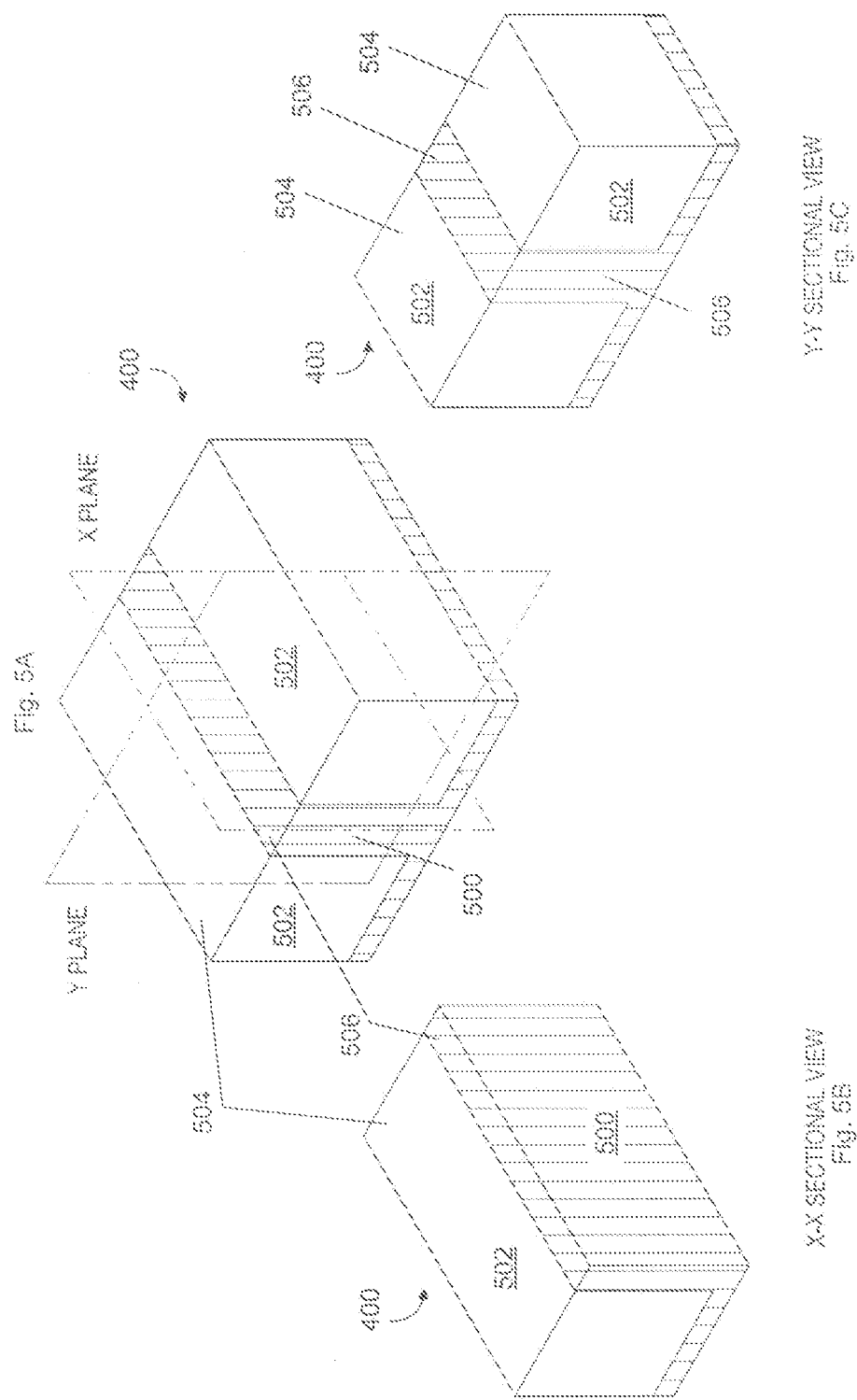

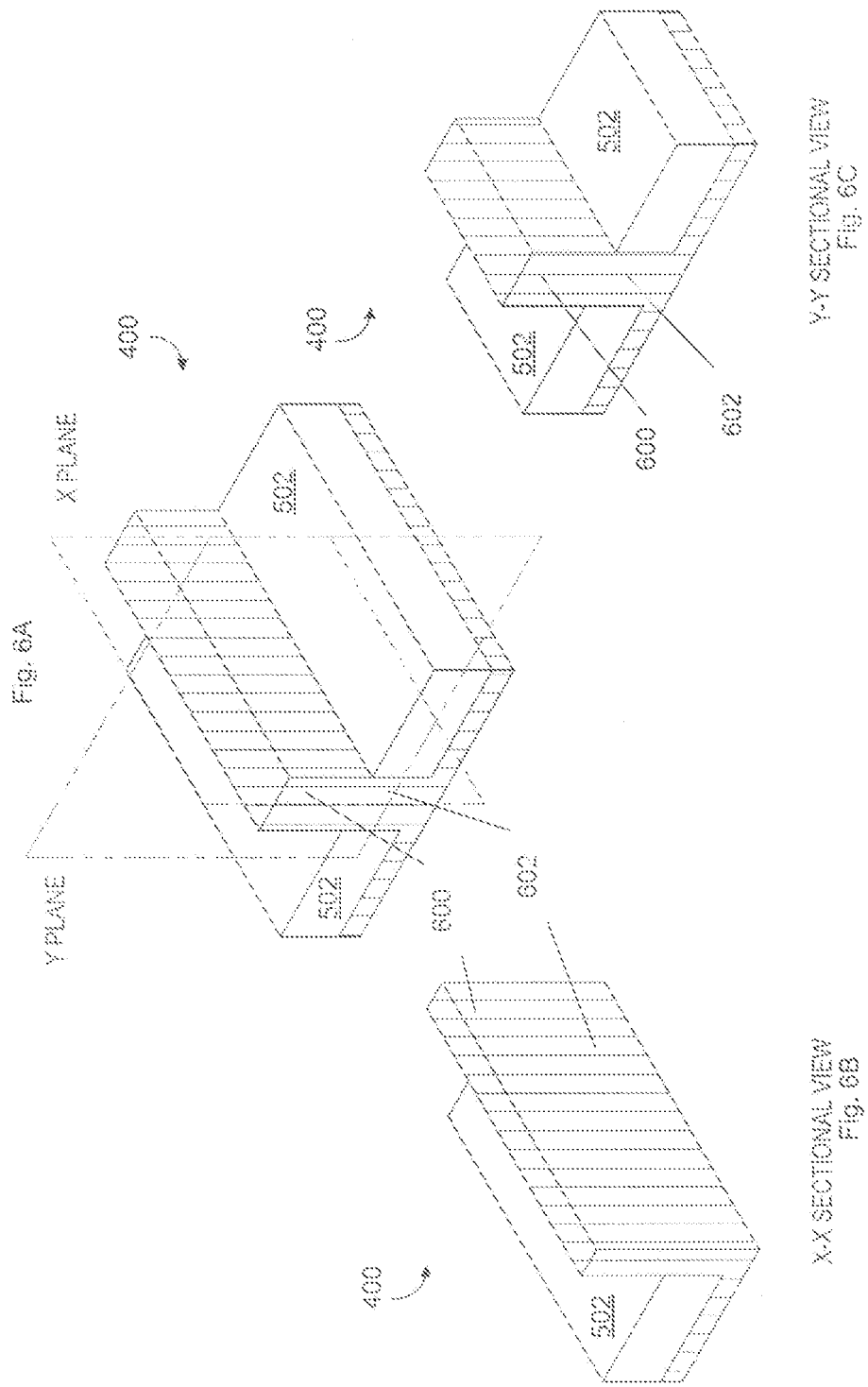

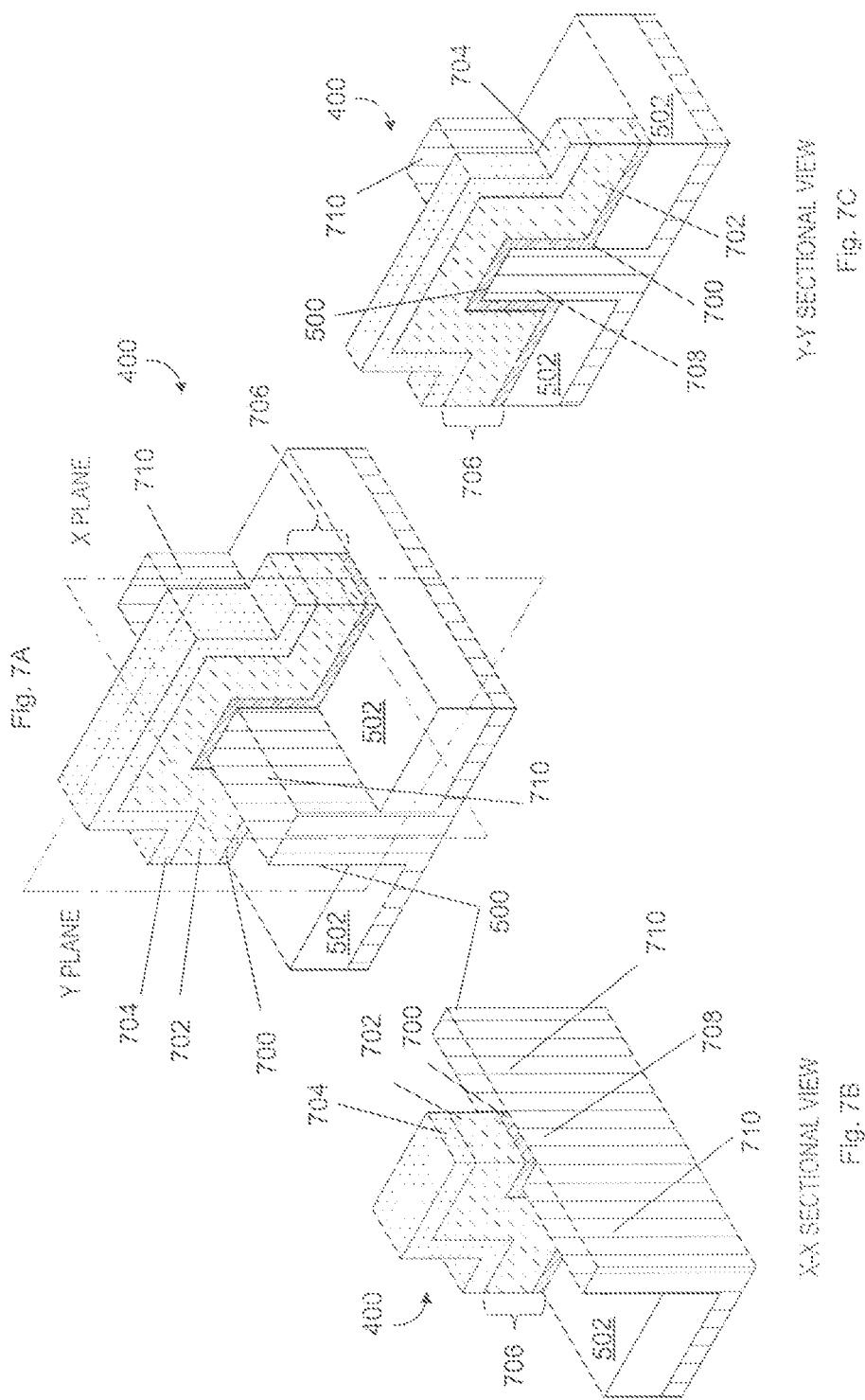

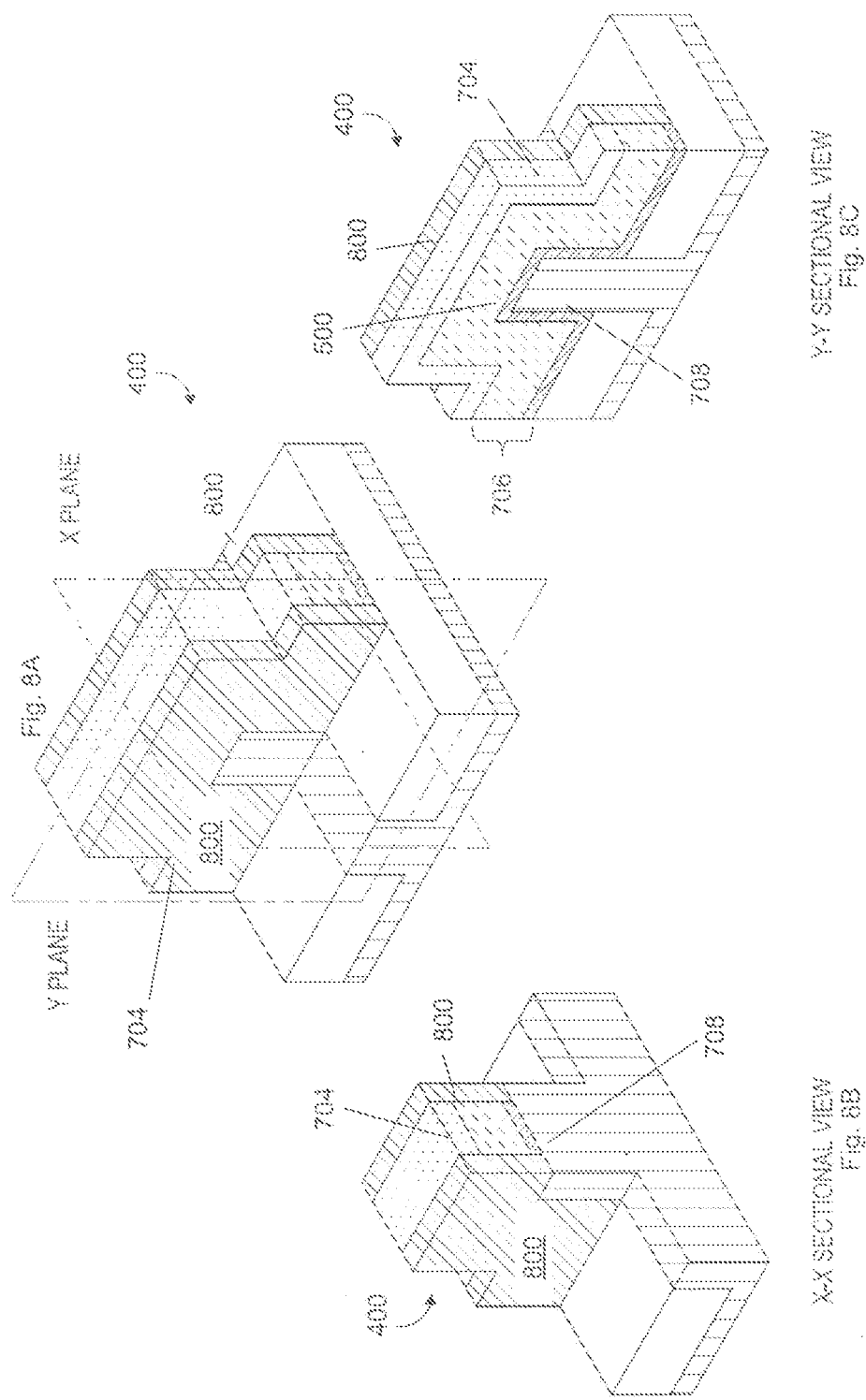

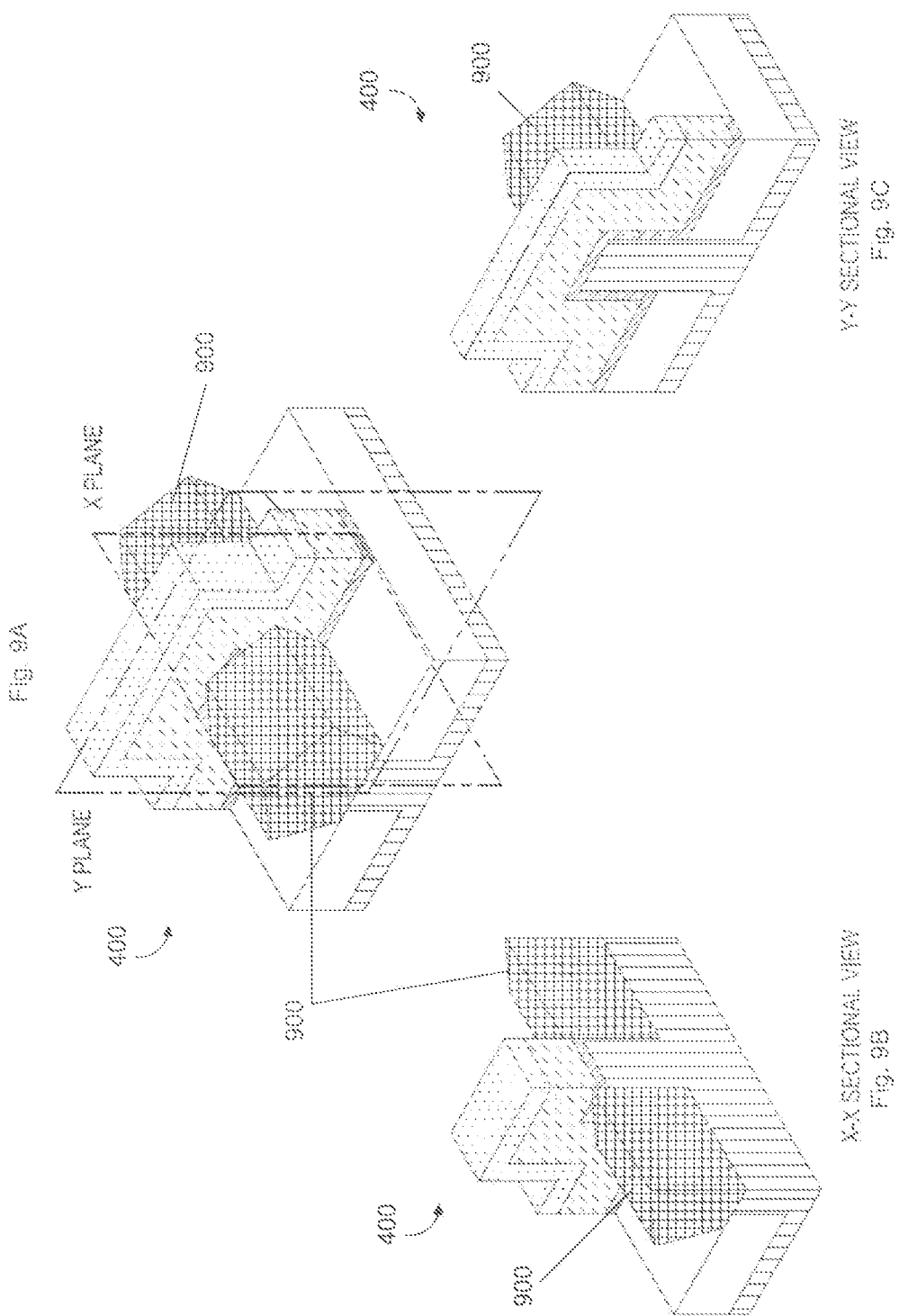

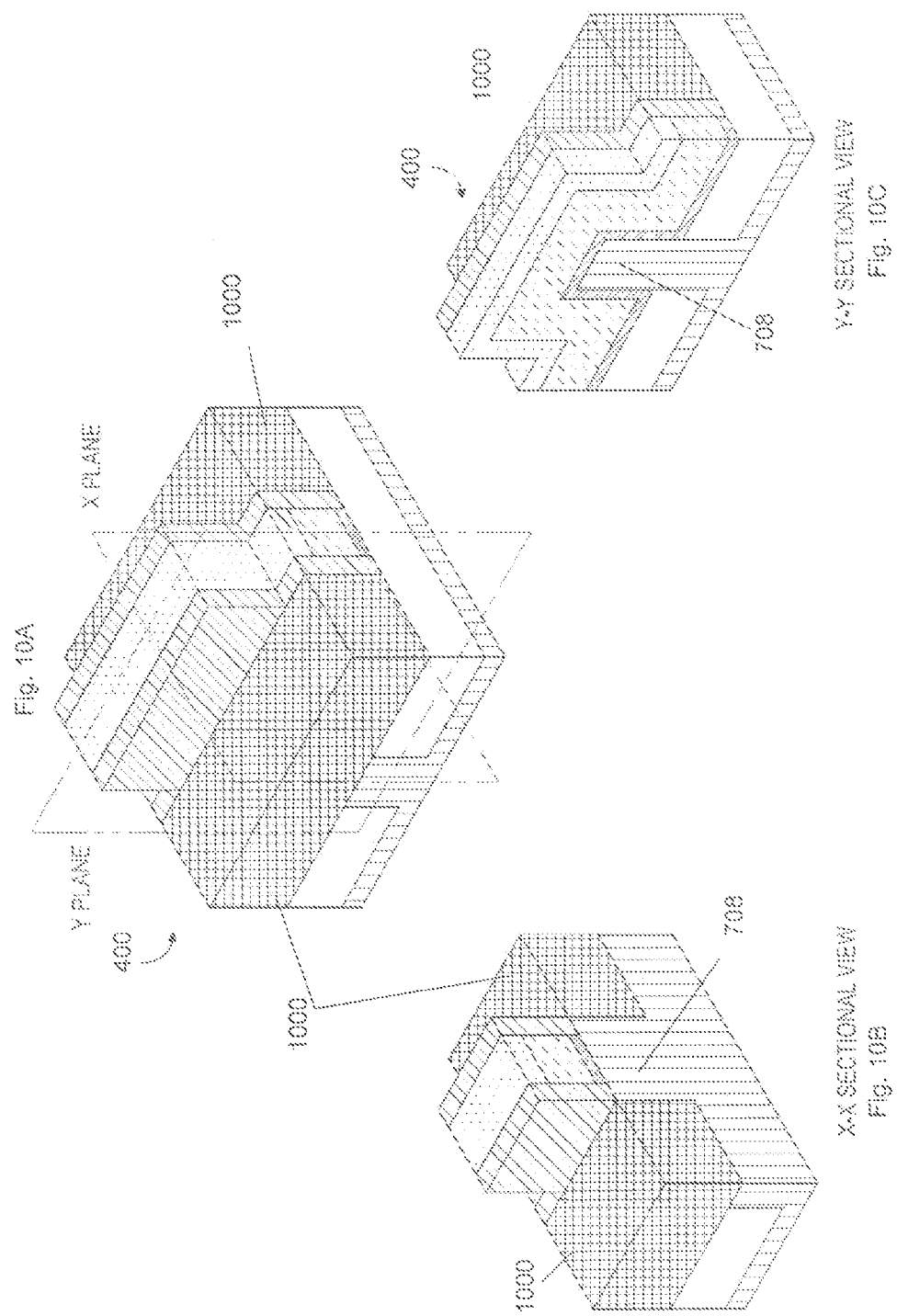

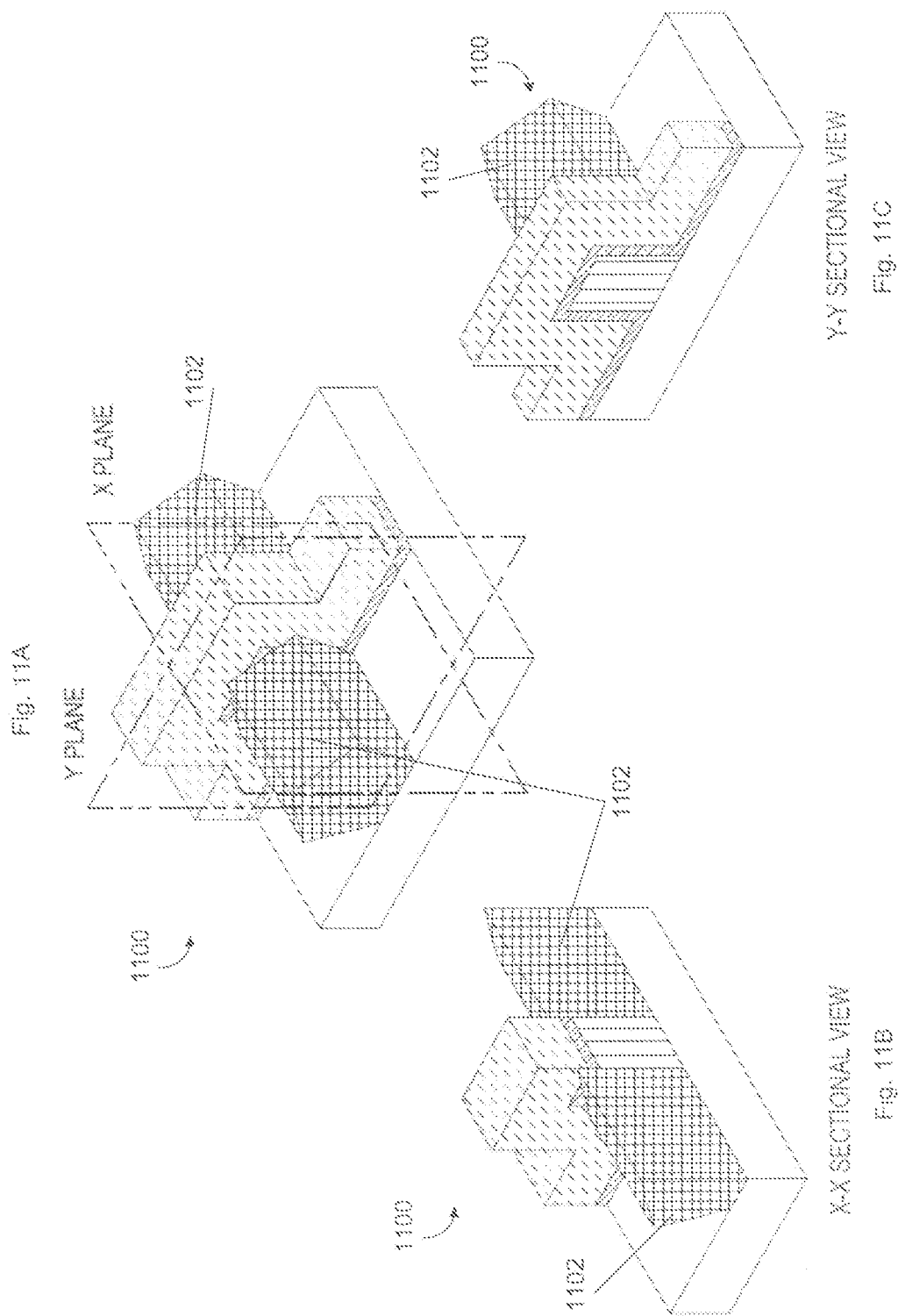

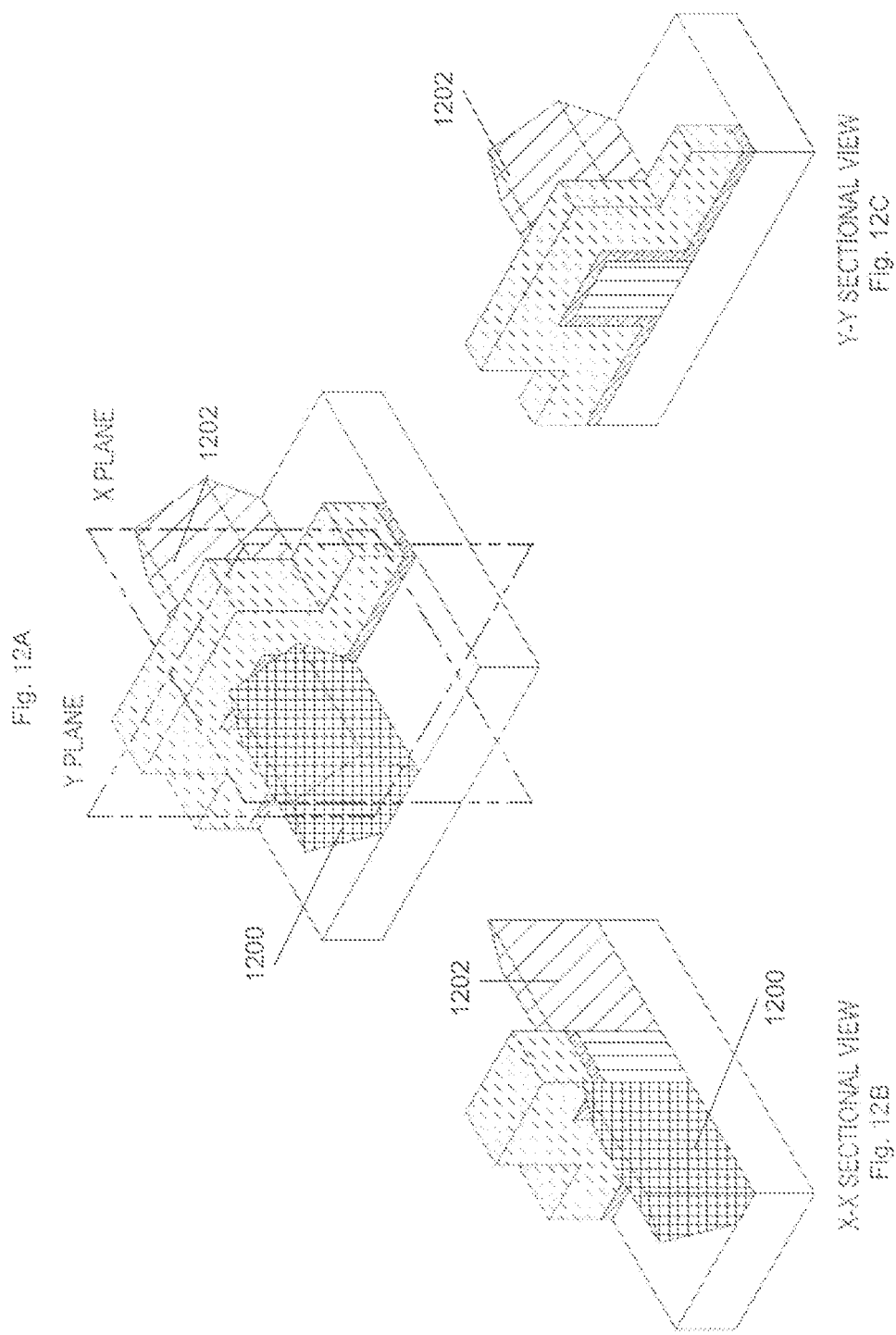

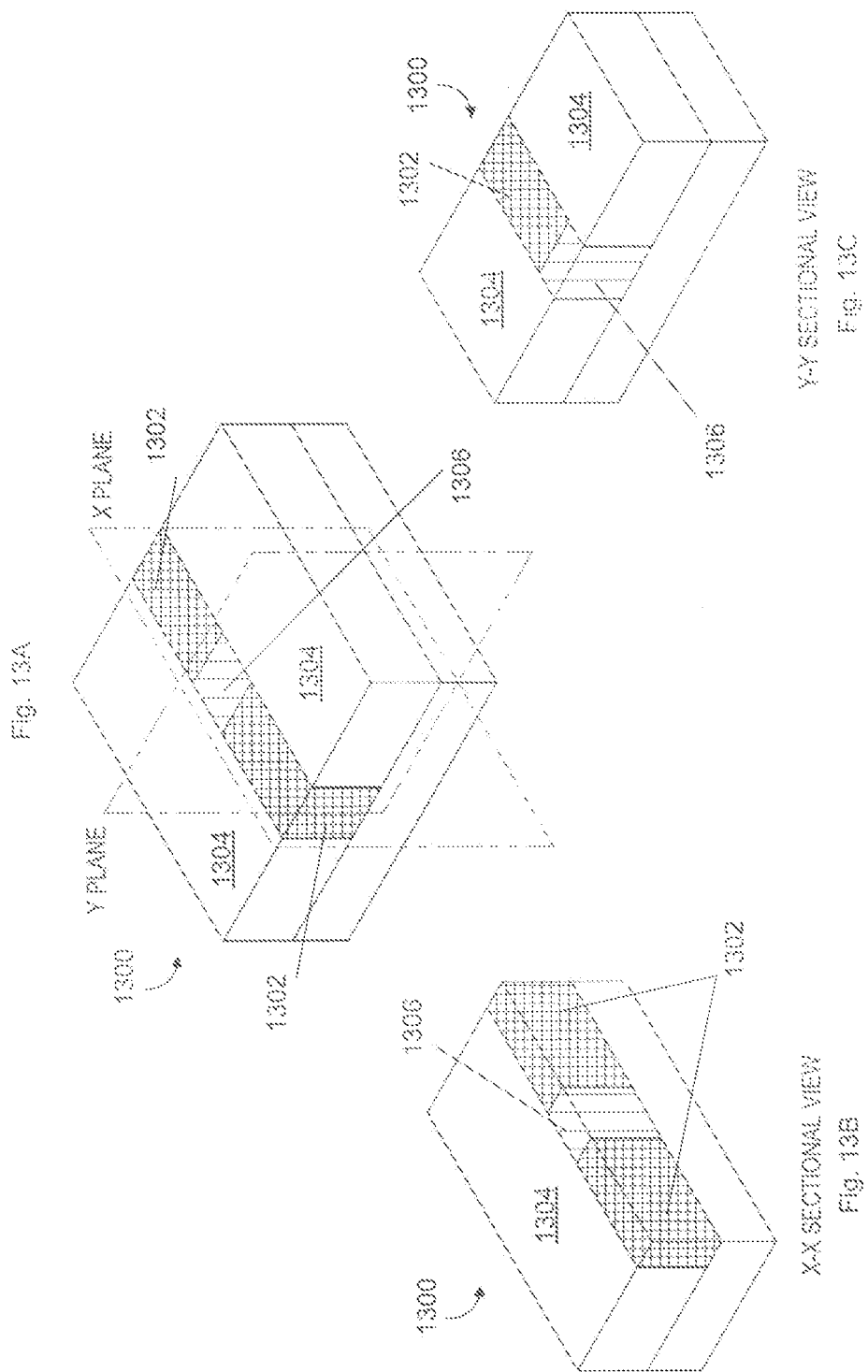

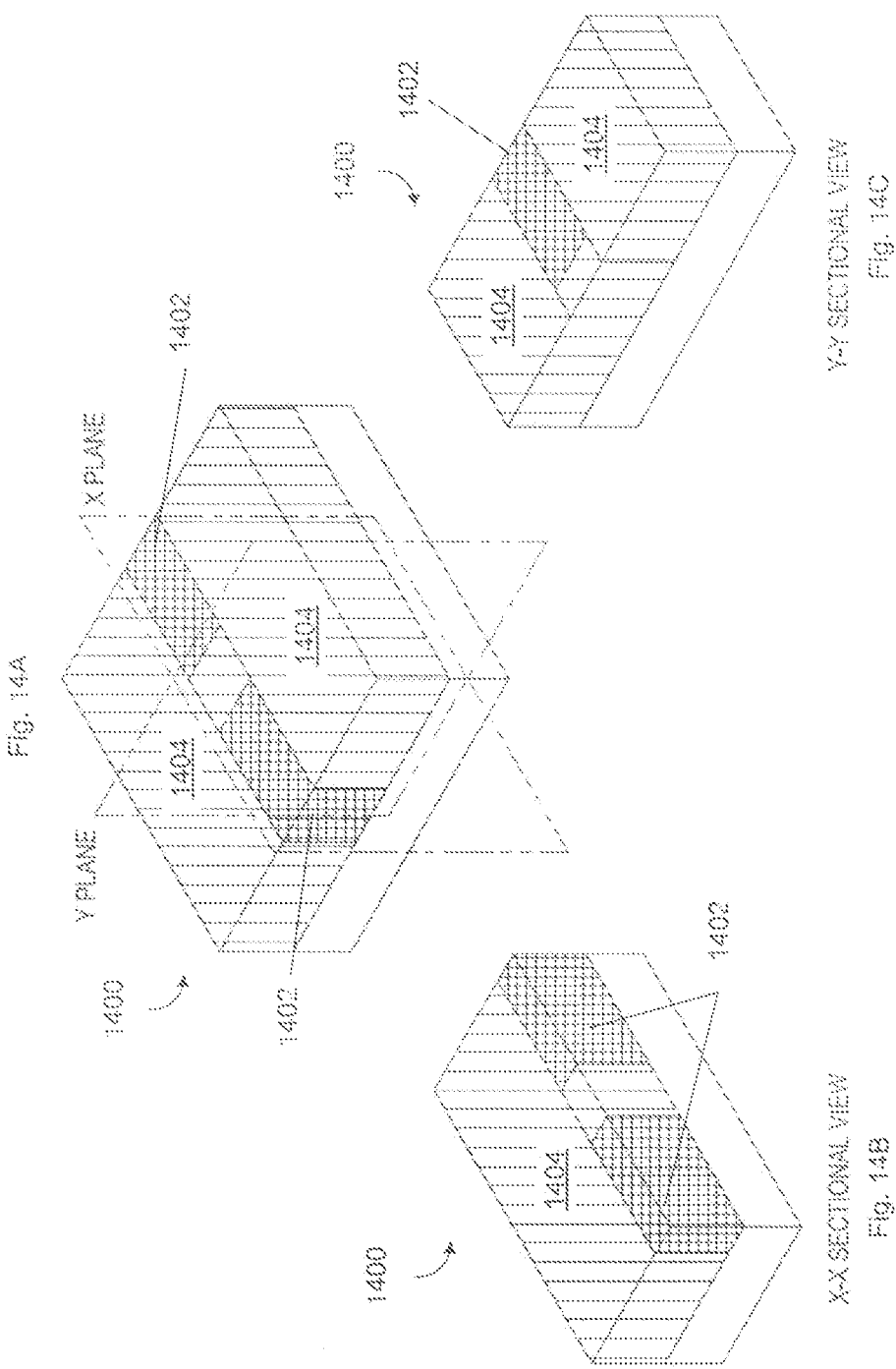

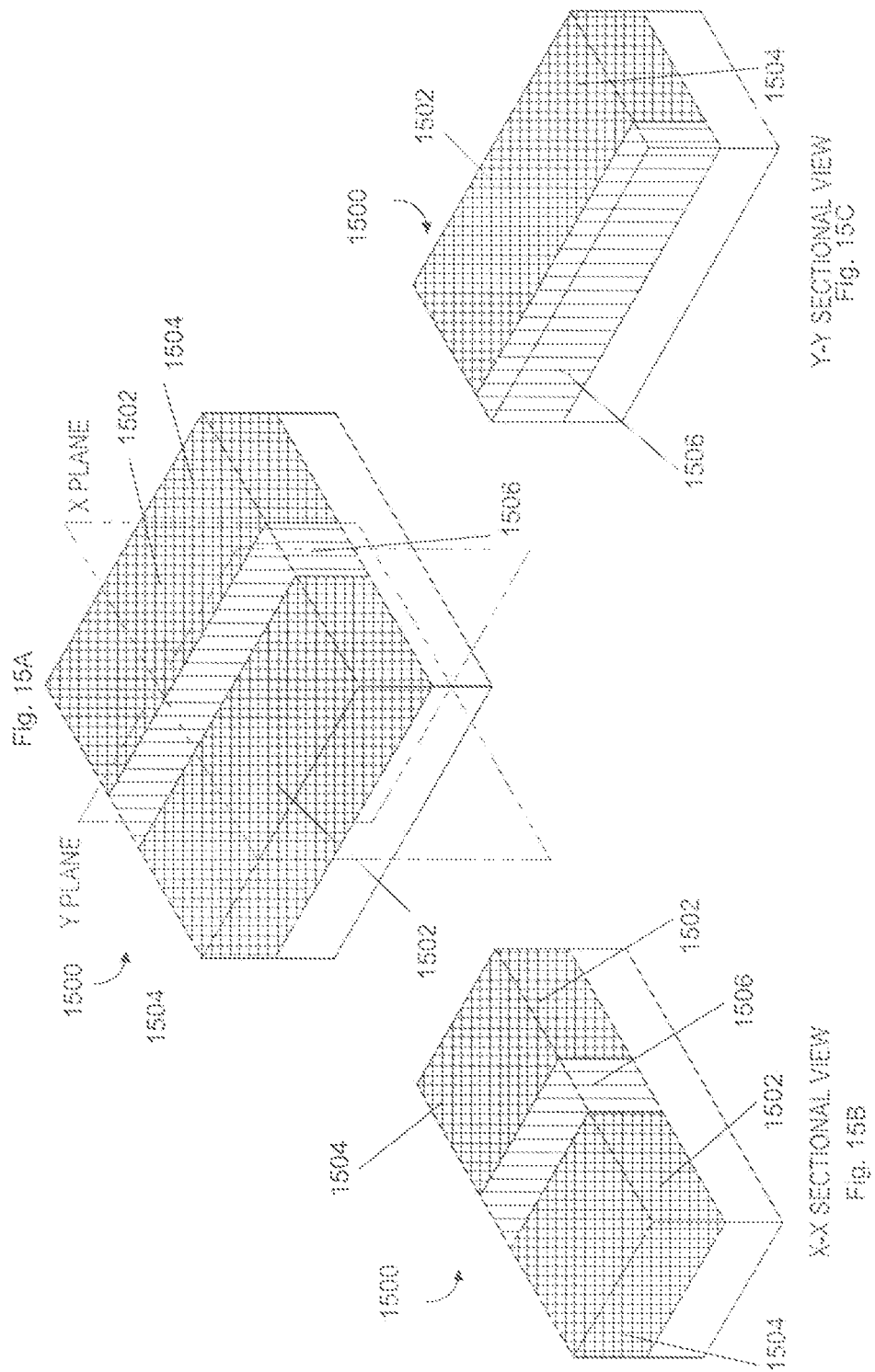

REPLACEMENT SOURCE/DRAIN FINFET FABRICATION

BACKGROUND

1. Field

The present disclosure relates generally to fabricating fin field effect transistors (finFETs), and, more specifically, to fabricating finFETs with replacement sources and drains.

2. Description of Related Art

A finFET is a non-planar multi-gate transistor that operates on the same principles as traditional metal oxide semiconductor field effect transistors (MOSFETs). An island or fin of silicon is first patterned on to the wafer. After forming the fin, a gate stack is deposited and patterned so that the patterned gate material runs perpendicular to the fin. Where the patterned gate material overlaps the fin, a gate for the finFET is formed. The finFET will have one gate on both vertical sidewalls of the fin. Depending on the size of the top surface of the fin, the finFET may also have a gate on top of the fin.

For example, FIG. 1 depicts finFET 100 formed on a silicon-on-insulator (SOI) wafer. Fin structure 102 protrudes from oxide layer 108 and is raised above shallow trench isolation (STI) 106. Gate stack 104 contacts fin structure 102 on three sides forming multiple gates. A channel region is defined by the region under gate stack 104 in fin structure 102. Source and drain regions are adjacent the channel region at opposite ends in fin structure 102.

FIG. 2 depicts traditional MOSFET 200 formed on oxide layer 208 of an SOI wafer. In contrast to finFET 100 (FIG. 1), silicon region 202 is planar with STI 206, which causes gate stack 204 to contact only a single side of silicon region 202 and form only a single gate.

The multiple gates of finFETs may offer many improvements over traditional MOSFETs. For example, finFETs may be more robust against short-channel effects and may offer higher current drive while improving subthreshold swing.

However, the non-planar nature of finFETs may lead to several difficulties during fabrication. For example, conventional implanters require line of sight to implant ions into a surface. To dope vertical sidewalls of the source or drain of a finFET, the wafer must be tilt-angle implanted. To overcome shadowing effects from nearby finFETs, the implant may need to be performed at multiple angles or orientations, which may increase implanter tool complexity, implanting cost, and processing time. Alternatively, design rules may be implemented that space non-planar structures far enough apart to minimize shadowing effects. However, using design rules to increase structure spacing will result in less dense circuits.

One alternative to tilt-angle implants is plasma doping. However, plasma doping may have its own set of disadvantages, such as doping control and limits on doping concentrations.

SUMMARY

In an exemplary embodiment, a finFET is formed having a fin with a source region, a drain region, and a channel region between the source and drain regions. The fin is etched on a semiconductor wafer. A gate stack is formed having an insulating layer in direct contact with the channel region and a conductive gate material in direct contact with the insulating layer. The source and drain regions are etched leaving the channel region of the fin. Epitaxial semiconductor is grown on the sides of the channel region that were adjacent the source and drain regions to form a source epitaxy region and a drain epitaxy region. The source and drain epitaxy regions are doped in-situ while growing the epitaxial semiconductor. The source and drain epitaxy regions may apply a strain to the channel region to improve the mobility of electrons or holes in the channel region.

DESCRIPTION OF THE FIGURES

The present application can be best understood by reference to the following description taken in conjunction with the accompanying figures, in which like parts may be referred to by like numerals.

FIG. 4A depicts a perspective view an exemplary embodiment of a finFET at an initial stage of fabrication according to the exemplary process depicted in FIG. 3.

FIG. 4B depicts a cross-section view of the exemplary embodiment along dotted cut plane 402 in FIG. 4A.

FIG. 4C depicts another cross-section view of the exemplary embodiment along dotted cut plane 404 in FIG. 4A.

FIGS. 5A-5C; 6A-6C; 7A-7C; 8A-8C; 9A-9C; and 10A-10C depict the exemplary embodiment at various stages of fabrication according to the exemplary process depicted in FIG. 3.

FIGS. 11A-11C depict an exemplary embodiment of a finFET on an SOI wafer.

FIGS. 12A-12C depict an exemplary embodiment of a finFET with asymmetrical source and drain regions.

FIGS. 13A-13C depict a stage of another exemplary process for fabricating a finFET.

FIGS. 14A-14C depict a stage of another exemplary process for fabricating a finFET.

FIGS. 15A-15C depict a stage of another exemplary process for fabricating a finFET.

The figures depict various embodiment of the present invention for purposes of illustration only. One skilled in the art will readily recognize from the following discussion that alternative embodiments of the structures and methods illustrated herein can be employed without departing from the principles of the invention described herein.

DETAILED DESCRIPTION

The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Figure 1:
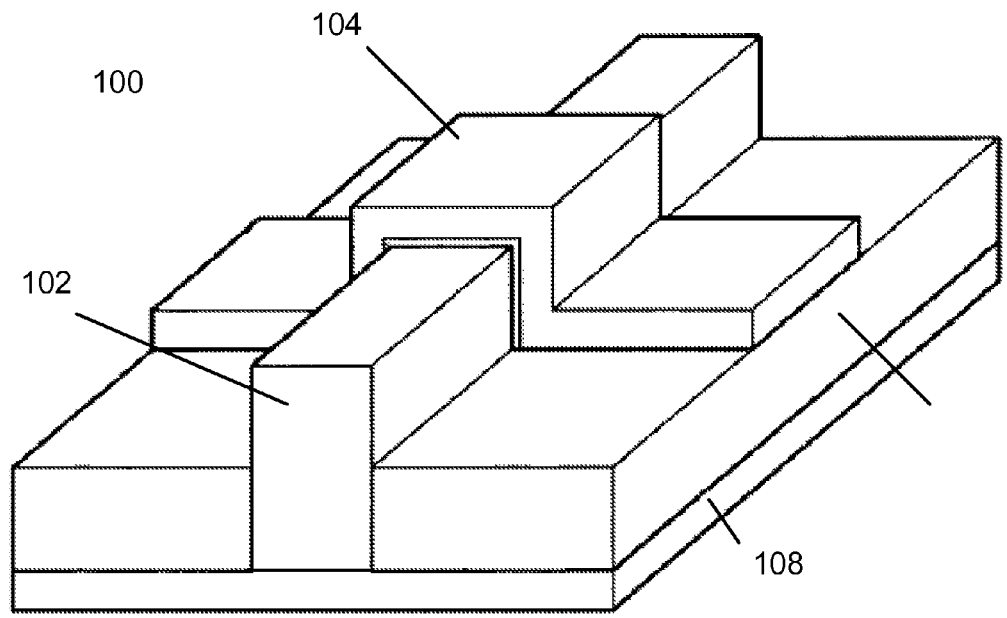
FIG. 1 depicts a finFET.
Figure 2:
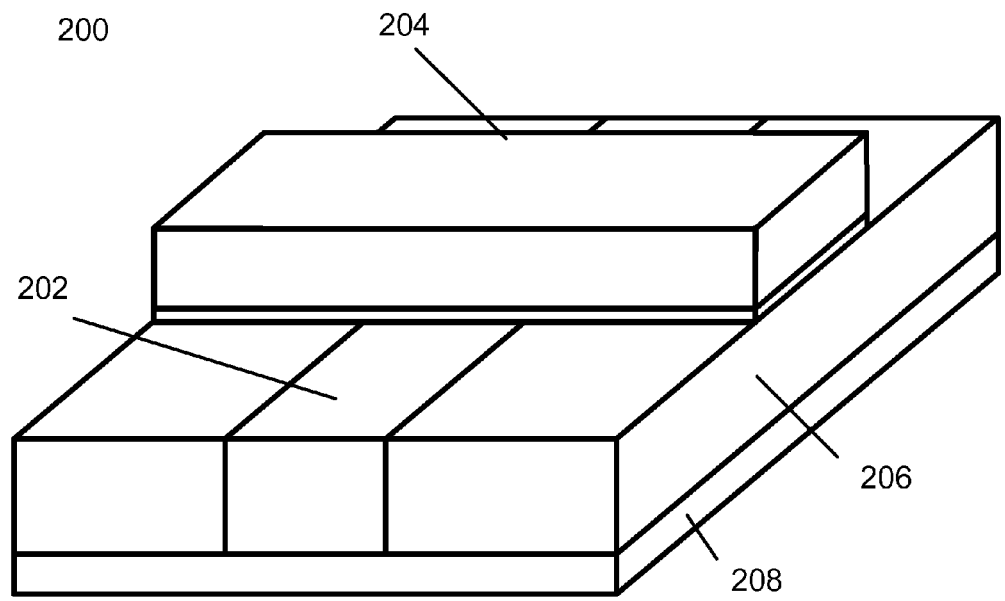
FIG. 2 depicts an SOI MOSFET.
Figure 3:
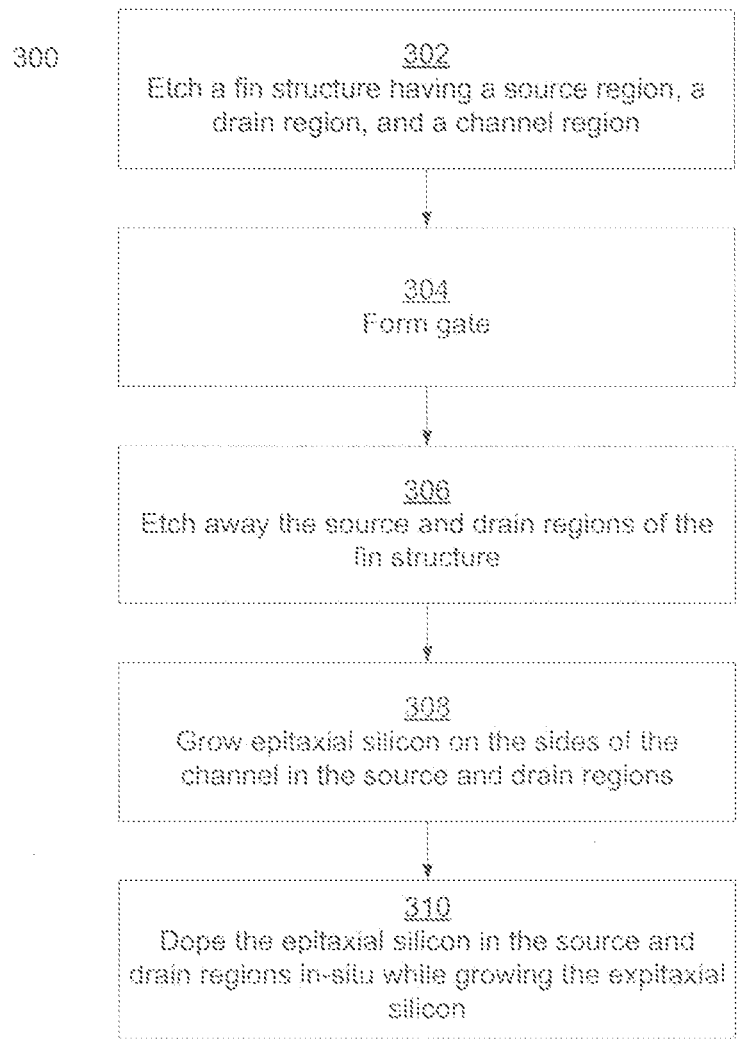
FIG. 3 depicts a flow chart of an exemplary process for forming a finFET.

FIG. 3 depicts an exemplary process 300 for fabricating a finFET. Corresponding FIGS. 4A-4C; 5A-5C; 6A-6C; 7A-7C; 8A-8C; 9A-9C; and 10A-10C depict the finFET at various stages of fabrication according to exemplary process 300 (FIG. 3).

In particular, FIGS. 4A-4C depict substrate 400, which is a portion of a semiconductor wafer. In the present exemplary embodiment, substrate 400 is a portion of a bulk silicon wafer. However, other types of wafers or substrates may also be used, such as SOI wafers. Also, semiconductor materials other than silicon may be used, including but not limited to Ge, SiGe, SiC, GeP, GeN, InGaAs, GaAs, InSb, InAs, GaSb, and InP.

With reference to FIG. 3, in operation 302, a fin structure is etched on the substrate. FIGS. 5A-5C depict substrate 400 after formation of fin structure 500, which is directly connected to the silicon of the wafer. This operation may use standard semiconductor masking and etching techniques to form fin structure 500.

Although not required, an STI region may also be formed after formation of fin structure 500. FIGS. 5A-5C depict substrate 400 after formation of STI 502. After forming fin structure 500, the STI insulating material may be deposited over the substrate. Planarizing techniques such as chemical-mechanical polishing (CMP) or etch-backs may be used to remove the STI insulating material until top 504 of STI 502 is approximately planar with top 506 of fin structure 500. While FIGS. 5A-5C show STI 502 being perfectly planar with fin structure 500, in practice there may be a small step between these regions. Even with a small step, the regions are still considered to be approximately planar. In other exemplary processes, the STI formation may take place later in the processing. For example, the STI formation may take place after the source/drain regions have been etched and refilled, as discussed below with respect to FIGS. 14A-14C and 15A-15C.

If an STI region is formed, an etch-back may also be used to expose a portion of the fin structure. FIGS. 6A-6C depict substrate 400 after an etch-back of STI 502 to expose top portion 600 of fin structure 500. Bottom portion 602 of fin structure 500 remains covered by STI 502. In one example, the STI insulating material is made of silicon dioxide. In this example, an etch that is selective to oxide over the silicon of the wafer may be used to etch STI 502 without etching significant amounts of fin structure 500. Alternatively, a photoresist mask or hardmask may be used to protect fin structure 500 during the etch-back. In other exemplary processes that form an STI region, for example as discussed below with reference to FIGS. 12A-12C, the etch-back may alternatively be performed later in the process after the source/drain regions have been etched and refilled.

With reference back to FIG. 3, in operation 304, the gate of the finFET is formed by depositing and patterning a gate stack. FIGS. 7A-7C depict substrate 400 after a gate stack has been deposited and patterned to form a gate. The deposition of the gate stack starts with growing or depositing gate dielectric 700 over substrate 400. FIGS. 7A-7C depict gate dielectric 700 being present over fin structure 500 and STI 502. Accordingly, in the case of FIGS. 7A-7C, gate dielectric 700 is either a deposited material or a material that may be grown on silicon as well as the insulating material of STI 502. If gate dielectric 700 is thermal oxide, the portion of gate dielectric 700 over STI 502 will not be present.

Next, conductive gate material 702 is deposited. In one example, conductive gate material 702 is poly or amorphous silicon, which may be implanted to reduce resistance and set the gate workfunction. Other conductive gate materials, such as metals, may also be used.

In other exemplary embodiments, the gate stack may also be a high-k, metal gate (HKMG) stack. For example, a metal gate, such as titanium nitride, with high-k gate dielectrics, such as such as hafnium dioxide ($HfO_2$), zirconium dioxide ($ZrO_2$), or titanium dioxide ($TiO_2$), may be used. The HKMG stack may be formed with a dielectric-first, gate-first, dielectric-last, or gate-last process.

For example, in a dielectric-last HKMG process, the gate stack may be initially formed as a traditional silicon dioxide and polysilicon stack that is used as a sacrificial stack during front-end of line processing. Then, before proceeding to back-end of line processing, a portion of this sacrificial stack may be removed and replaced with a gate stack that includes a high-k dielectric and a metal gate. This is also an example of a gate-last HKMG process.

In another example of a gate-last HKMG process, the gate dielectric may be formed with a high-k material (with or without traditional dielectrics) and polysilicon for the gate material. Then, before proceeding to the back-end of line processing, the polysilicon gate will be removed and replaced with a metal gate. The gate dielectric deposited earlier in the front-end of line processing will remain. This is also an example of a dielectric-first HKMG process.

In a gate-first, dielectric-first HKMG process, both the high-k gate dielectric and the metal gate are formed during the front-end of line processing.

After the gate stack is deposited, hardmask layer 704 is deposited and patterned. The patterned hardmask may used to etch conductive gate material 702 and optionally gate dielectric 700. The remaining gate stack material forms gate 706. Channel 708 is the region in fin structure 500 that is approximately covered by gate 706. Source and drain 710 are in either end of fin structure 500 adjacent to channel 708. In a discrete device as is being described, the source and drain are described together as they are interchangeable.

In other processes, the hardmask may be omitted if a photoresist mask is used to pattern gate 706. The gate dielectric may also be left unetched over the entire wafer. It may be removed, for example, in the spacer etch step as described with respect to FIGS. 8A-8C.

With reference to FIG. 3, in operation 306, some or all of the source/drain regions are etched leaving the channel region under the gate of the fin structure remaining. In one example of this operation, the gate hardmask, along with a spacer, may be used as the mask for the source/drain etch. FIGS. 8A-8C depict substrate 400 after the formation of spacer 800 and the etching of source and drain 710 (FIG. 7A) to remove fin structure 500 in those regions. The formation of spacer 800 may start with deposition of an insulating spacer material over substrate 400. A blanket spacer etch may then be performed. The spacer insulating material on the sidewalls of gate 706 will be protected from the etch. After the etch is completed by, for example, a set time or end-point, spacers 800 will remain. Additionally, hardmask layer 704, left on the wafer after patterning the gate, may still remain after the spacer insulating material is etched away. Hardmask layer 704 and spacer 800 may then be used as a mask to etch source and drain 710 (FIG. 7A). After the source and drain etch, most or all of the silicon from source and drain 710 (FIG. 7A) is removed, leaving channel 708 of fin structure 500.

Operation 306 may also omit the spacer related operations. This version of operation 306 may use only the hardmask to etch the source and drain regions. In other example of operation 306, a photoresist mask may used instead of a hardmark.

With reference to FIG. 3, in operation 308, portions of the source and drain that were etched in operation 306 are refilled with silicon. FIGS. 10A-10C depict substrate 400 after etched source and drain 710 (FIG. 7A) have been refilled with silicon 1000. This may be done, for example, by depositing polysilicon or growing epitaxial silicon. If the sidewalls of channel 708 have been damaged during the source and drain etch, the sidewalls may optionally be prepared to receive new silicon by, for example, thermally oxidizing the sidewalls to consume damaged silicon. Even though source and drain 710 (FIG. 7) were silicon, other semiconductors may be used to refill the regions. In this case, the channel region and the source/drain regions would be made of different materials.

With reference to FIG. 3, in operation 310, which occurs concurrently with operation 308, the source and drain are doped in-situ while being refilled with silicon. With reference again to FIGS. 10A-10C, by doping while depositing or growing silicon 1000, tilt angle and plasma implants may be avoided. Additionally, because in-situ doping allows for a constant heavy doping across silicon 1000, the source and drain resistances may be reduced as compared to implants alone. The thermal steps involved with activating any source and drain implants may also be avoided.

If a blanket silicon deposition or growth is used, an additional etch step may be needed to remove silicon from non-source and non-drain areas. CMP or an etch-back (with or without a masking step) may be used to remove silicon from regions that should be non-conducting (e.g., to remove any silicon that may be shorting the source and drain). For example, as depicted in FIGS. 10A-10C, silicon 1000, which was deposited to refill previously etched source and drain 710 (FIG. 7A), has been etched back so that the top of gate 706 is exposed and the source and drain are not shorted together.

While silicon 1000 of FIGS. 10A-10C is depicted with one particular shading, the crystalline structure of silicon 1000 may vary across the device. For example, if silicon 1000 is produced with an epitaxial process, the portion of silicon 1000 in the source and drain regions may be crystalline while the portion of silicon 1000 over the STI may be polycrystalline. The use of a single shading for silicon 1000 is not intended to indicate that silicon 1000 has a uniform crystalline structure or necessarily has other uniform characteristics.

Alternatively, selective epitaxial growth may be used to grow silicon only on exposed silicon (e.g. silicon portions of the wafer that are exposed after removal of the source and drain in operation 306) and not on other materials (e.g., the STI insulator). FIGS. 9A-9C depict substrate 400 after selectively growing silicon 900 to refill etched source and drain 710 (FIG. 7A). With selective epitaxy, an etch-back step may not be necessary. FIGS. 9A-9C are in contrast to FIGS. 10A-10C, which depict substrate 400 after non-selective growth and an etch-back step. The shape of source and drain 900 in FIGS. 9A-9C is only intended to be exemplary of a shape produced by using selective epitaxy to regrow the source and drain regions. Other shapes of the source and drain regions may also be produced without deviating from the exemplary embodiments of this invention.

To control the thermal budget, initially, a high-temperature epitaxy process may be used to grow an initial thickness of high quality silicon. Polysilicon may then be deposited at a lower temperature to refill more of the source and drain. CMP, an etch-back, or both may also be used to plannerize the wafer. Additionally, an etch-back may be required to remove silicon from non-source and non-drain regions, as described above.

While FIGS. 9A-9C and 10A-10C depict the etched source and drain being completely refilled with silicon, in other cases, only a portion of the source and drain needs to be refilled with silicon.

In addition to creating a low-resistance source and drain, the replacement of source and drain 710 (FIG. 7A) may also add strain to channel 708 (FIG. 10A). For example, SiGe or SiC (if using a silicon substrate) may be grown with selective epitaxy on the sides of channel 708 (FIG. 10A) where the source and drain regions were etched away. The different lattice constants of SiGe or SiC as compared to Si (or other semiconductor material forming the channel) may strain the semiconductor in channel 708, which may increase the mobility of electrons or holes in channel 708.

While the first exemplary process was described with respect to several processing steps, those skilled in the art will recognize that other well-known processing steps will also be required to create a functioning finFET. For example, threshold adjust implants may be needed to properly set the threshold voltage for n-type or p-type finFETs. As another example, the refilling of the source and drain through deposition or epitaxial growth of silicon may need to be performed twice: once for p-type finFETs requiring p-type sources and drains and once for n-type finFETs requiring n-type sources and drains.

FIGS. 11A-11C depict another exemplary embodiment of a finFET on substrate 1100. This exemplary embodiment is similar to the exemplary embodiment depicted in FIGS. 10A-10C, except that an SOI wafer is used for substrate 1100 instead of a bulk wafer as described above. Also, the process used for this exemplary embodiment does not include formation of an STI region. The shape of source and drain 1102 in FIGS. 11A-11C is only intended to be exemplary of a shape produced by using selective epitaxy to regrow the source and drain region. Other shapes of the source and drain regions may also be produced without deviating from embodiments of the invention.

FIGS. 12A-12C depict another exemplary embodiment of a finFET with asymmetrical source 1200 and drain 1202 that have different material properties. For example, source 1200 and drain 1202 may be made of different materials. As another example, the doping of the two regions could be different. In yet another example, the strain of the two regions could be different. This exemplary embodiment requires source 1200 and drain 1202 to be grown separately. The shape of source 1200 and drain 1202 in FIGS. 12A-12C is only intended to be exemplary of a shape produced by using selective epitaxy to regrow the source and drain region. Other shapes of the source and drain regions may also be produced without deviating from embodiments of the invention.

FIGS. 13A-13C depict a stage of another exemplary process. This exemplary process is similar to exemplary process 300 (FIG. 3), except that the STI etch-back step described above with respect to FIGS. 5A-5C is performed later in the process. FIGS. 13A-13C depict substrate 1300 after formation of fin structure 1306 (described in operation 302), deposition of STI 1304 (described with respect to FIGS. 5A-5C), and etching and refilling of source drain 1302 (described in operations 306, 308, and 310). The etch-back of STI 1304, however, has not occurred yet. The STI etch-back step (described with respect to FIGS. 5A-5C) occurs at some point prior the gate formation (operation 304). Substrate 1300 is depicted as an SOI wafer; however, this process can be used on a bulk wafer as well.

FIGS. 14A-14C depict a stage of another exemplary process for fabrication of a finFET. This exemplary process is similar to exemplary process 300 (FIG. 3), except the source and drain etch and refill (described in operations 306, 308, and 310) takes place prior to formation of the fin structure (described in operation 302). In this process, a standard photoresist mask may be used to etch away source and drain 1402 prior to refilling. Additionally, only silicon that will form source and drain 1402 are etched and refilled. Region 1404 remains unetched and is the original top surface of substrate 1400. A subsequent stage in this exemplary process forms a fin structure as described above with respect to operation 302. Substrate 1400 is depicted as an SOI wafer; however, this process can be used with a bulk wafer as well.

FIGS. 15A-15C depict a stage of another exemplary process for fabrication of a finFET. This exemplary process is similar to the exemplary process described above with reference to FIGS. 14A-14C, except in addition to source and drain 1502 being etched and refilled, area 1504 around source and drain 1502 are also etched and refilled. Only region 1506 remains of the original top surface of substrate 1500. A subsequent stage in this exemplary process forms a fin structure as described above with respect to operation 302. Substrate 1500 is depicted as an SOI wafer; however, this process can be used with a bulk wafer as well.

While source and drain 1502 and area 1504 around source and drain 1052 of FIGS. 15A-15C are depicted with one particular shading, the crystalline structure of these areas may vary across the foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. device. For example, if epitaxy is used to regrow silicon in these areas, the silicon adjacent region 1506 may be crystalline while the silicon further away from region 1506 may be polycrystalline. The use of a single shading is not intended to mean that these areas have uniform crystalline structure or necessarily have other uniform characteristics.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching.

We claim:

1. A method for fabricating a fin field effect transistor (finFET) with a fin having a source region, a drain region, and a channel region between the source and drain regions, the method comprising:
   etching the fin from a portion of a semiconductor substrate;
   depositing an isolation layer around and on the fin;
   etching the isolation layer back so that a top portion of two side surfaces of the fin are exposed while the isolation layer still covers a bottom portion of said two side surfaces of the fin;
   forming a gate stack on the channel region on a top surface of the fin and on the exposed top portion of the two side surfaces of the fin, the gate stack having an insulating layer in direct contact with the channel region, and a gate material in direct contact with the insulating layer;
   etching the source and drain regions to leave the channel region remaining;
   growing epitaxial semiconductor on the sides of the channel region that were adjacent the source and drain regions to form a source epitaxy region and a drain epitaxy region, respectively; and
   doping the epitaxial semiconductor in-situ while growing the epitaxial semiconductor;
   wherein etching the source and drain and growing the epitaxial semiconductor occur prior to etching the fin.

2. The method of claim 1 further comprising:
   polishing the isolation layer to have a top surface approximately coplanar with the top surface of the fin.

3. The method of claim 2, wherein depositing the isolation layer and polishing the isolation layer occur prior to forming the gate stack.

4. The method of claim 1, wherein the source epitaxy region adds strain to at least a part of the channel region to improve the mobility of electrons or holes in the channel region.

5. The method of claim 1, wherein the semiconductor substrate is a bulk silicon wafer.

6. The method of claim 1, wherein the drain epitaxy region is a different material than the semiconductor wafer.

7. The method of claim 1, wherein the epitaxial semiconductor is grown selectively to a material of the semiconductor substrate.

8. The method of claim 1 further comprising:
   forming a metal gate over the channel region.

9. The method of claim 8, further comprising:
   depositing the isolation layer on the channel region before forming the metal gate over the channel region.

10. A method for fabricating a fin field effect transistor (finFET) with a fin having a source region, a drain region, and a channel region between the source and drain regions, the method comprising:
    etching the fin from a portion of a semiconductor substrate;
    depositing an isolation layer around and on the fin;
    etching the isolation layer back so that a top portion of two side surfaces of the fin are exposed while the isolation layer still covers a bottom portion of said two side surfaces of the fin;
    forming a gate stack on the channel region on a top surface of the fin and on the exposed top portion of the two side surfaces of the fin, the gate stack having an insulating layer in direct contact with the channel region and a gate material in direct contact with the insulating layer;
    etching a portion of the source region and a portion of the drain region from the fin to expose sidewalls of the channel region;
    refilling with silicon the etched portion of the source region and the etched portion of the drain region; and
    while refilling, doping the silicon in-situ;
    wherein the refilled and doped portion of the source region adds strain to the channel region to increase mobility of electrons or holes in the channel region; and
    wherein etching a portion of the source region and a portion of the drain region and refilling with silicon occur prior to etching the fin.

11. The method of claim 10 further comprising:
    thermally oxidizing the exposed sidewalls of the channel region to consume damaged silicon.

12. The method of claim 10 further comprising:
    polishing the isolation layer to have a top surface approximately coplanar with the top surface of the fin.

13. The method of claim 10 further comprising:
    depositing the isolation layer on the channel region; and
    forming a metal gate over the channel region.

14. A method for fabricating a fin field effect transistor (finFET) with a fin having a source region, a drain region, and a channel region between the source and drain regions, the method comprising:
    etching the fin from a portion of a semiconductor substrate;
    depositing an isolation layer around and on the fin;
    etching the isolation layer back so that a top portion of two side surfaces of the fin are exposed while the isolation layer still covers a bottom portion of said two side surfaces of the fin;
    forming a gate stack on the channel region on a top surface of the fin and on the exposed top portion of the two side surfaces of the fin, the gate stack having an insulating layer in direct contact with the channel region and a gate material in direct contact with the insulating layer;
    etching a portion of the source region and a portion of the drain region from the fin to expose sidewalls of the channel region;
    selectively growing epitaxial semiconductor on the exposed sidewalls of the channel region, on the etched portion of the source region, and on the etched portion of the drain region; and
    while selectively growing epitaxial semiconductor, doping the epitaxial semiconductor in-situ;
    wherein the doped portion of the source region adds strain to the channel region to increase mobility of electrons or holes in the channel region; and
    wherein etching a portion of the source region and a portion of the drain region and selectively growing epitaxial semiconductor occur prior to etching the fin.

15. The method of claim 14 further comprising:
    thermally oxidizing the exposed sidewalls of the channel region.

16. The method of claim 14 further comprising:
    polishing the isolation layer to have a top surface approximately coplanar with the top surface of the fin.

17. The method of claim 14 further comprising:
    depositing the isolation layer on the channel region; and
    forming a metal gate over the channel region.

18. The method of claim 14, wherein selectively growing epitaxial semiconductor comprises a high-temperature epitaxy process.

19. The method of claim 18 further comprising:
after the high-temperature epitaxy process, depositing polysilicon on the grown epitaxial semiconductor.

* * * * *